United States Patent
Choi et al.

(10) Patent No.: US 9,331,690 B2
(45) Date of Patent: May 3, 2016

(54) SWITCHING CIRCUIT AND RF SWITCH INCLUDING THE SAME

(71) Applicant: SAMSUNG ELECTRO-MECHANICS CO., LTD., Suwon-Si, Gyeonggi-Do (KR)

(72) Inventors: Jae Hyouck Choi, Suwon-Si (KR); Kyu Jin Choi, Suwon-Si (KR); Suk Chan Kang, Suwon-Si (KR); Jeong Hoon Kim, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 168 days.

(21) Appl. No.: 14/320,837

(22) Filed: Jul. 1, 2014

(65) Prior Publication Data

US 2015/0180470 A1  Jun. 25, 2015

(30) Foreign Application Priority Data

Dec. 20, 2013  (KR) .................. 10-2013-0160519

(51) Int. Cl.
*H03K 17/687* (2006.01)

(52) U.S. Cl.
CPC .................. *H03K 17/6871* (2013.01)

(58) Field of Classification Search
CPC ....... H02M 1/08; H02M 3/158; H02M 1/088; H03K 17/6871; H03K 17/687; G05F 1/648; H03H 7/24
USPC ........ 333/262, 258, 101, 103, 81 R; 327/427, 327/434, 308; 323/225, 268, 271, 297, 298, 323/353, 354
See application file for complete search history.

(56) References Cited

U.S. PATENT DOCUMENTS

| | | | | |
|---|---|---|---|---|
| 8,058,922 B2* | 11/2011 | Cassia | ................ | H03F 3/72 327/308 |
| 9,190,994 B2* | 11/2015 | Hurwitz | ................ | H03K 17/161 |
| 2011/0260774 A1* | 10/2011 | Granger-Jones | ..... | H03K 17/102 327/427 |
| 2012/0001676 A1 | 1/2012 | Iraha et al. | | |
| 2012/0075004 A1* | 3/2012 | Miyazawa | ........... | H03K 17/102 327/434 |
| 2013/0278317 A1* | 10/2013 | Iversen | ................ | H03K 17/102 327/308 |

FOREIGN PATENT DOCUMENTS

| | | |
|---|---|---|
| JP | 2012-44637 A | 3/2012 |
| KR | 10-2012-0069529 A | 6/2012 |

* cited by examiner

*Primary Examiner* — Gary L Laxton
*Assistant Examiner* — Kyle J Moody
(74) *Attorney, Agent, or Firm* — NSIP Law

(57) ABSTRACT

A switching circuit may include a switching circuit unit; a reference voltage unit connected between the switching circuit unit and a signal input terminal and providing a preset reference voltage; and a voltage generating unit dividing a first control voltage provided to the switching circuit unit by a preset magnitude to generate a second control voltage corresponding to the reference voltage, and providing the second control voltage to bodies of the plurality of respective switching devices.

14 Claims, 5 Drawing Sheets

SWITCHING CIRCUIT AND RF SWITCH INCLUDING THE SAME

CROSS-REFERENCE TO RELATED APPLICATION

This application claims the benefit of Korean Patent Application No. 10-2013-0160519 filed on Dec. 20, 2013, with the Korean Intellectual Property Office, the disclosure of which is incorporated herein by reference.

BACKGROUND

The present disclosure relates to a switching circuit and a RF (Radio Frequency) switch including the same.

In accordance with the development of wireless communications technology, various communications standards have been used simultaneously. In addition, in accordance with the miniaturization of wireless communications modules and improvements in the performance of portable communications terminals, the need for single portable communications terminals to conform to a plurality of communications standards has become apparent. Therefore, the amount of frequency bands that a single portable communications terminal cellular phone should support has increased.

That is, in many cellular communications reception areas, existing second-generation (2G) and third-generation (3G) communications technologies have been supplemented with new communications technologies, such that fourth-generation (4G) communications schemes such as Long Term Evolution (LTE) have been widely implemented. In addition, in Wi-Fi areas, the IEEE 802.11ac standard has been added to the existing IEEE 802.11b/g/n to enhance marketability thereof.

In accordance with this trend, there has also been demand for support for various frequency bands within a radio frequency (RF) front end field. For example, there has been demand for support of various frequency bands with respect to a RF switch positioned on a signal path between an antenna and an RF chipset. Therefore, a Single Pole Double Throw (SPDT) type switch has been used in various fields.

Meanwhile, a Metal Oxide Silicon Field Effect Transistor (MOSFET), an example of a switching device used in a RF switch may be a floating body type transistor or a body contact type transistor. Such a floating body type transistor has excellent insertion loss, but harmonic performance thereof may be deteriorated. On the contrary, the body contact type transistor has excellent harmonic performance, but insertion loss performance thereof may be deteriorated.

The following Related Art Document (Patent Document 1), which relates to a switching circuit apparatus, discloses that a leakage current suppressing circuit unit is provided to an output unit of a driver circuit to suppress the intrusion of high frequency signals. However, unlike the present disclosure, contents in which a body terminal is not floated and a positive voltage is applied to a body of a switching device when the switching device is turned on to thereby significantly reduce a voltage difference between the body and a source of the switching device, are not disclosed in Patent Document 1.

RELATED ART DOCUMENT (Patent Document 1) Japanese Patent Laid-Open Publication No. 2012-44637

SUMMARY

An aspect of the present disclosure may provide a switching circuit capable of improving harmonic characteristics by not floating a body terminal of a switching device and applying a positive voltage to a body of the switching device when the switching device is turned on to thereby significantly reduce a voltage difference between the body and a source of the switching device, and a RF switch including the same.

According to an aspect of the present disclosure, a switching circuit may include: a switching circuit unit including a plurality of switching devices connected to each other in series; a reference voltage unit connected between the switching circuit unit and a signal input terminal and providing a preset reference voltage; and a voltage generating unit dividing a first control voltage provided to the switching circuit unit by a preset magnitude to generate a second control voltage corresponding to the reference voltage, and providing the second control voltage to bodies of the plurality of respective switching devices.

The switching circuit may further include a plurality of gate resistors respectively connected between respective control terminals of the plurality of switching devices and a common control terminal, wherein the plurality of switching devices respectively receive the first control voltage through the plurality of gate resistors.

The switching circuit may further include a plurality of body resistors respectively connected between the respective bodies of the plurality switching devices and a common body terminal, wherein the plurality of switching devices respectively receive the second control voltage through the plurality of body resistors.

The reference voltage unit may include at least one resistor element.

The voltage generating unit may include first and second resistor elements connected to each other in series and may divide the first control voltage by resistance values of the first and second resistor elements to generate the second control voltage.

The reference voltage unit may receive the second control voltage from the voltage generating unit to set the reference voltage.

Each of the plurality of switching devices may be a metal oxide silicon field effect transistor (MOSFET) and the MOSFET may have a gate thickness of 2.2 nm or less.

According to another aspect of the present disclosure, a RF switch may include: a common port connected to an antenna to transmit and receive a high frequency signal; a first switching unit having a plurality of first body contact type switching devices connected to each other in series between the common port and a first port; a second switching unit having a plurality of second body contact type switching devices connected to each other in series between the common port and a second port; a first reference voltage unit disposed between the first switching unit and the first port to provide a first reference voltage; and a second reference voltage unit disposed between the second switching unit and the second port to provide a second reference voltage, wherein the first switching unit divides a voltage received from a first common control terminal of the plurality of first body contact type switching devices by a resistance value preset in such a manner that a voltage difference between the first reference voltage and the voltage received from the first common control terminal is not present, to thereby provide the divided voltage to a first common body terminal of the plurality of first body contact type switching devices, and the second switching unit divides a voltage received from a second common control terminal of the plurality of second body contact type switching devices by a resistance value preset in such a manner that a voltage difference between the second reference voltage and the voltage received from the second common control terminal is not present, to thereby provide the divided voltage to a second common body terminal of the plurality of second body contact type switching devices.

The first switching unit may further include a first voltage generating unit connected between the first common control terminal and the first common body terminal, and the second switching unit may further include a second voltage generating unit connected between the second common control terminal and the second common body terminal.

The first voltage generating unit may include first and second resistor elements connected to each other in series and may divide the voltage received from the first common control terminal by resistance values of the first and second resistor elements to thereby provide the divided voltage to the first common body terminal, and the second voltage generating unit may include third and fourth resistor elements connected to each other in series and may divide the voltage received from the second common control terminal by resistance values of the third and fourth resistor elements to thereby provide the divided voltage to the second common body terminal.

Each of the first and second reference voltage units may include at least one resistor element.

The first reference voltage unit may receive a voltage output from the first voltage generating unit to set the first reference voltage, and the second reference voltage unit may receive a voltage output from the second voltage generating unit to set the second reference voltage.

The RF switch may further include: a first shunting unit connected between the second port and the second switching unit to allow or block a signal transfer path between the second port and a ground; and a second shunting unit connected between the first port and the first switching unit to allow or block a signal transfer path between the first port and a ground.

Each of the plurality of first and second body contact type switching devices may be a metal oxide silicon field effect transistor (MOSFET) and the MOSFET may have a gate thickness of 2.2 nm or less.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
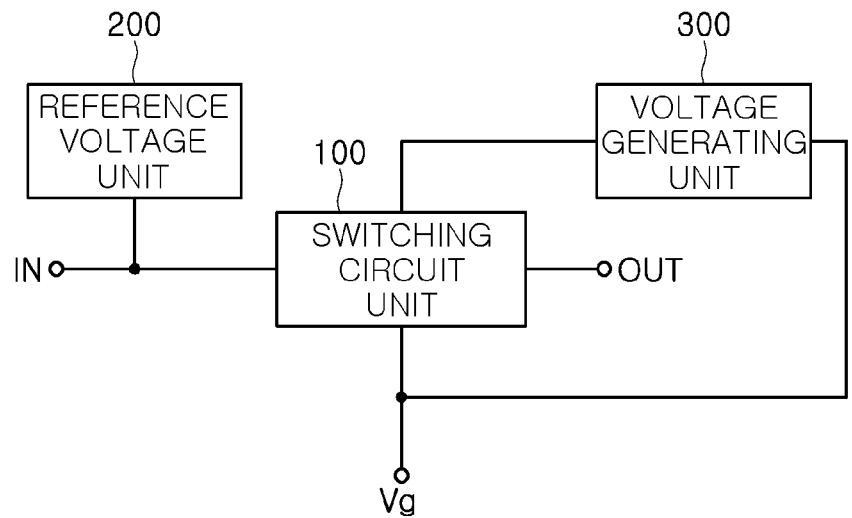
FIG. 1 is a block diagram illustrating a switching circuit according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Throughout the drawings, the same or like reference numerals will be used to designate the same or like elements.

FIG. 1 is a block diagram illustrating a switching circuit according to an exemplary embodiment of the present disclosure.

Figure 2:
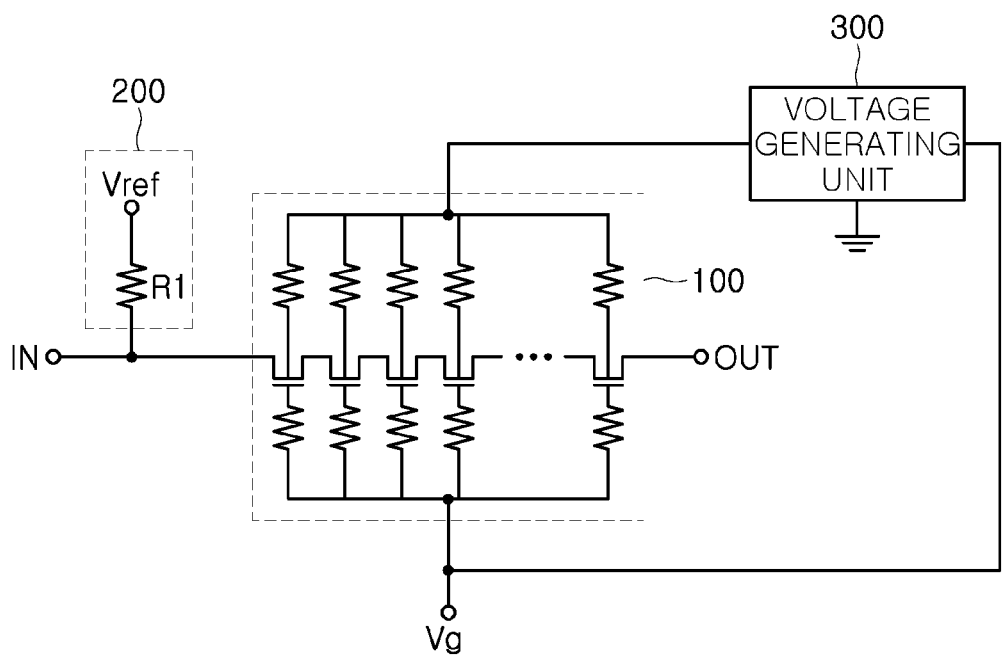
FIG. 2 is a circuit diagram illustrating the switching circuit shown in FIG. 1 in more detail.

FIG. 2 is a circuit diagram illustrating the switching circuit shown in FIG. 1 in more detail.

Referring to FIG. 1, the switching circuit according to an exemplary embodiment of the present disclosure may include a switching circuit unit 100, a reference voltage unit 200, and a voltage generating unit 300.

The switching circuit unit 100 may include a plurality of switching devices that are connected to each other in series. One example of the plurality of switching devices may be metal oxide silicon field effect transistors (MOSFETs). The number of MOSFETs configuring the switching circuit unit 100 may be appropriately changed by a withstand voltage required by the switching circuit. In addition, each of the plurality of MOSFETs has a source terminal and a drain terminal, which are not distinguished from each other in a structure of the MOSFET. Therefore, in the present specification, the meaning that the MOSFETs are connected to each other in series is that one of source and drain terminals of one MOSFET is connected to one of source and drain terminals of another MOSFET. Here, a case in which the plurality of switching devices according to an exemplary embodiment of the present disclosure are MOSFETs will be described as an example.

Referring to FIG. 2, the plurality of respective switching devices may have bodies connected to a common body terminal through body resistors, and the common body terminal may be connected to the voltage generating unit 300. That is, the plurality of switching devices may be body contact type FETs and in this case, the body resistors may be provided to reduce loss caused by leakage power from a body region.

Meanwhile, respective gate resistors may be provided between gate terminals of the plurality of switching devices and a common control terminal.

The plurality of switching devices may allow or block a signal transfer path between a signal input terminal IN and a signal output terminal OUT by performing a switching operation.

Meanwhile, each of the plurality of switching devices may be formed as a thin gate, and the thin gate may have a thickness of 2.2 nm or less.

The reference voltage unit 200 may be connected between the signal input terminal IN and the switching circuit unit 100 and may provide a preset reference voltage. Referring to FIG. 2, the reference voltage unit 200 may include at least one resistor element R1. In this case, a preset reference voltage will be described below with reference to FIG. 3.

The voltage generating unit 300 may divide a first control voltage provided to the switching circuit unit 100 according to a preset magnitude to generate a second control voltage corresponding to the reference voltage and may provide the second control voltage to the respective bodies of the plurality of switching devices.

Referring to FIG. 2, the voltage generating unit 300 may be connected between the common control terminal and the common body terminal of the switching circuit unit 100. This will be described in detail with reference to FIG. 3.

Figure 3:
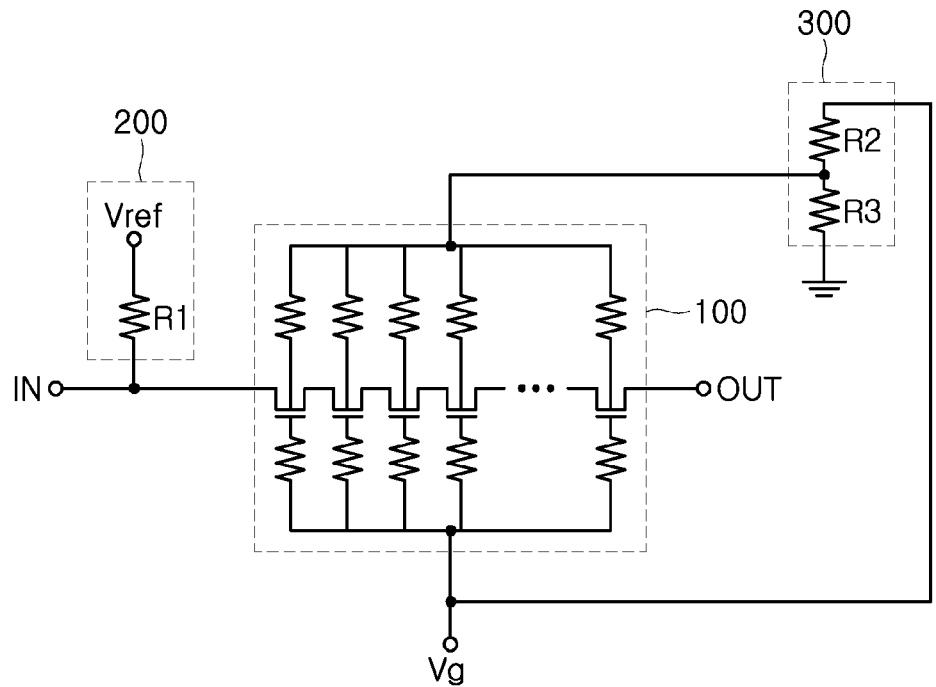
FIG. 3 is a circuit diagram illustrating a voltage generating unit in the switching circuit shown in FIG. 1 in more detail.

FIG. 3 is a circuit diagram illustrating the voltage generating unit 300 in the switching circuit shown in FIG. 1 in more detail.

Referring to FIG. 3, the voltage generating unit 300 may include first and second resistor elements R2 and R3 connected to each other in series.

The first and second resistor elements R2 and R3 may respectively have preset resistance values and the second resistor element R3 may have one end thereof connected to a ground.

That is, the voltage generating unit 300 may receive a first control voltage Vg from the common control terminal of the switching circuit unit 100 and divide the received first control voltage Vg by resistance values of the first and second resistor elements R2 and R3 to thereby generate a second control voltage. In addition, the voltage generating unit 300 may provide the generated second control voltage to the common body terminal of the switching circuit unit 100.

An operation of the switching circuit according to an exemplary embodiment of the present disclosure will be described in more detail.

First, a case in which all the plurality of switching devices included in the switching circuit unit 100 are turned on to allow the signal transfer path between the signal input terminal IN and the signal output terminal OUT will be described.

Referring to FIG. 3, in a case in which the first control voltage Vg is high, the plurality of switching devices of the switching circuit unit 100 may be turned on. In this case, when the second control voltage is Vb, the second control voltage may be expressed by the following Equation 1.

$$\text{The second control voltage } Vb=\{R3/(R2+R3)\}*\text{the first control voltage } Vg. \quad \text{[Equation 1]}$$

In this case, the resistance values of the first resistor element R2 and the second resistor element R3 may be preset such that a voltage difference between the second control voltage Vb and the reference voltage provided by the at least one resistor element R1 is not present. In this case, the voltage difference between the reference voltage and the second control voltage Vb may not be generated.

Therefore, the resistance values of the first and second resistor elements R2 and R3 may be set such that a voltage difference between the second control voltage provided to the common body terminal of the switching circuit unit 100 and the reference voltage is not generated.

In this case, a high frequency signal may not flow in the common body terminal and the plurality of switching devices of the switching circuit unit 100 may be normally turned on.

Next, a case in which all the plurality of switching devices included in the switching circuit unit 100 are turned off to block the signal transfer path between the signal input terminal IN and the signal output terminal OUT will be described.

In a case in which each of the plurality of switching devices included in the switching circuit unit 100 is turned off, since the reference voltage has a value higher than the second control voltage Vb, a gate to source voltage Vgs and a body to source voltage Vbs of each of the plurality of switching devices may have a negative value.

In this case, the gate to source voltage Vgs of each of the plurality of switching devices may be expressed by the following Equation 2. In addition, the body to source voltage Vbs of each of the plurality of switching devices may be expressed by the following Equation 3.

$$\text{The gate to source voltage } Vgs=\text{the first control voltage } Vg-\text{the reference voltage} \quad \text{[Equation 2]}$$

$$\text{The body to source voltage } Vbs=\text{the reference voltage}-\text{the second control voltage } Vb \quad \text{[Equation 3]}$$

In this case, according to the related art, when each of the plurality of switching devices is turned off to be 0V, a case which a portion of the switching devices is slightly turned on occurs, such that linearity of the switching circuit including the plurality of switching devices may be deteriorated.

However, in the switching circuit according to an exemplary embodiment of the present disclosure, the gate to source voltage Vgs and the body to source voltage Vbs each have the negative voltage and correspondingly, each of the plurality of switching devices is turned off, such that a complete turn off state may be implemented.

That is, in the switching circuit according to an exemplary embodiment of the present disclosure, linearity of the switching circuit may be improved by using the negative voltage when the plurality of switching devices are in the turn off state, and the plurality of switching devices may be thin gate body contact type switching devices each having a gate thickness of 2.2 nm, such that a current leaked to the gate may be prevented and the switching devices may be normally operated, whereby an on-resistance (Ron) may be reduced to thereby reduce loss.

In addition, since a separate negative voltage generating circuit does not need to be included, it is advantageous in terms of chip size.

Meanwhile, in a switching circuit according to another exemplary embodiment of the present disclosure, the reference voltage unit 200 may set the reference voltage by receiving the second control voltage generated by the voltage generating unit 300, rather than setting the reference voltage through the resistor element.

Figure 4:
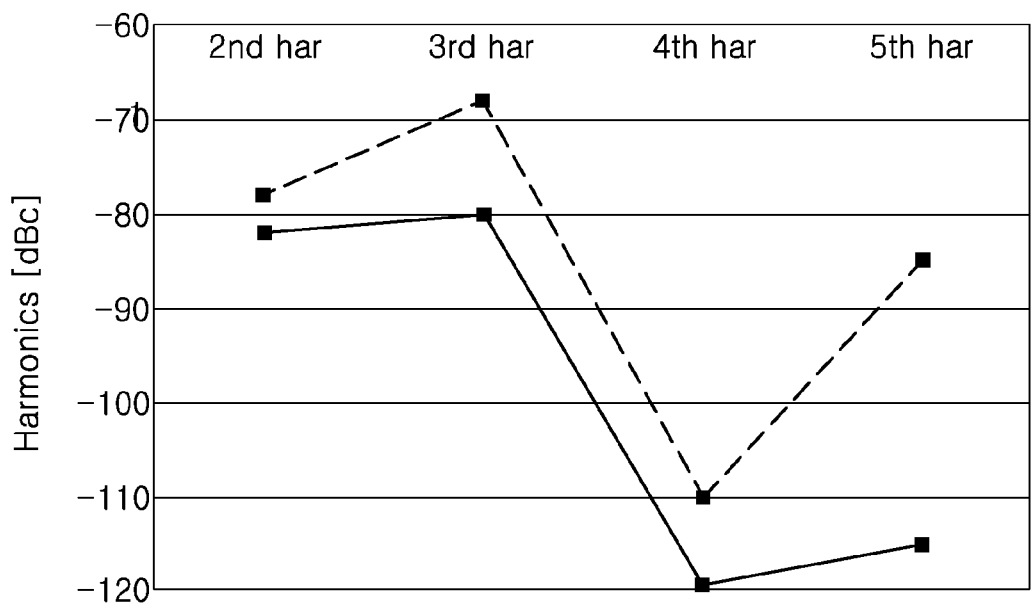
FIG. 4 is a graph illustrating harmonic characteristics of the switching circuit according to an exemplary embodiment of the present disclosure.

FIG. 4 is a graph illustrating harmonic characteristics of the switching circuit according to an exemplary embodiment of the present disclosure.

Referring to FIG. 4, it may be appreciated that harmonic characteristics (solid line) of the switching circuit according to an exemplary embodiment of the present disclosure are increased by 10 dBc or more as compared to harmonic characteristics (dotted line) of the switching circuit according to the related art.

Figure 5:
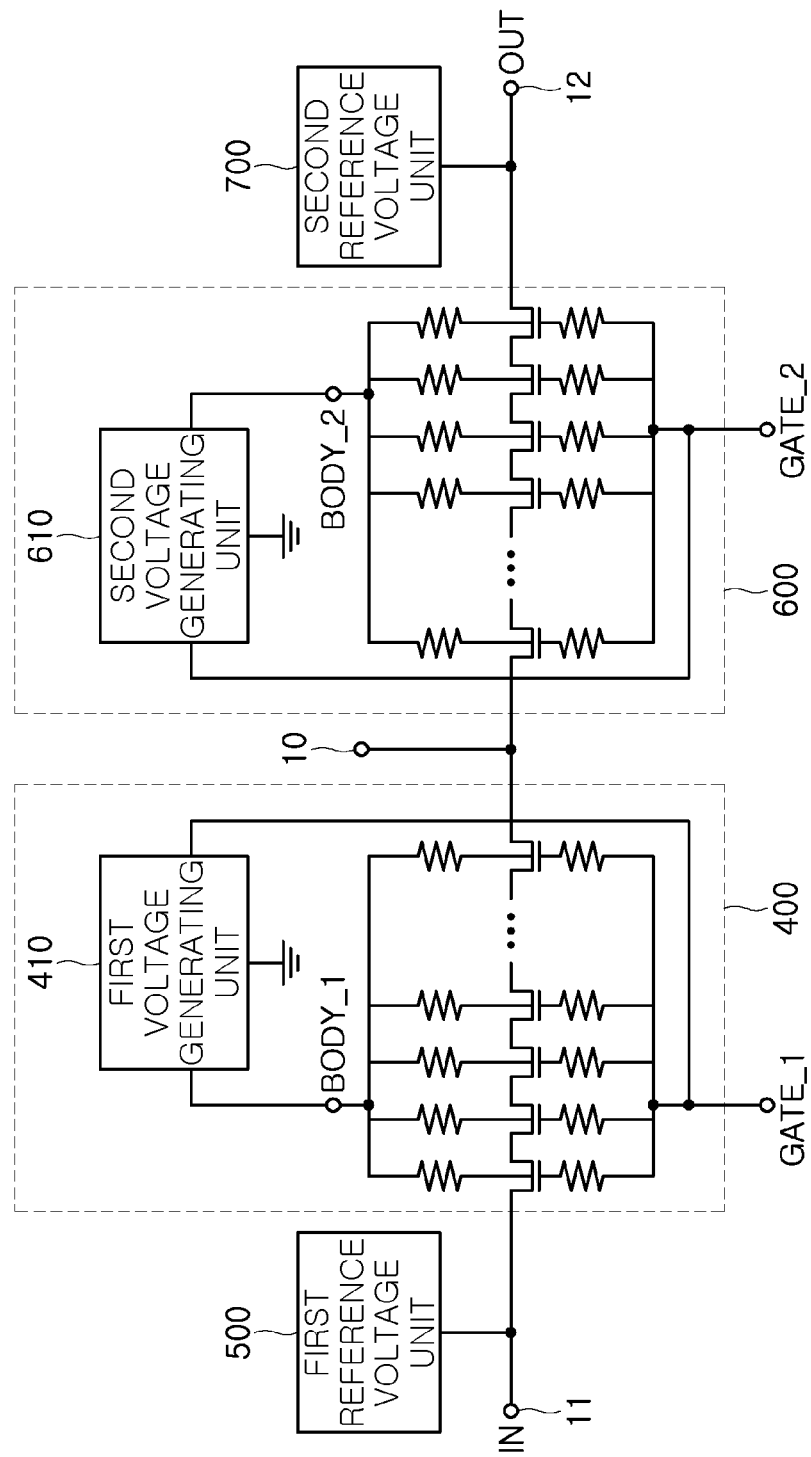
FIG. 5 is a block diagram illustrating a RF switch according to an embodiment of the present disclosure.

FIG. 5 is a block diagram illustrating a RF switch according to an embodiment of the present disclosure.

Figure 6:
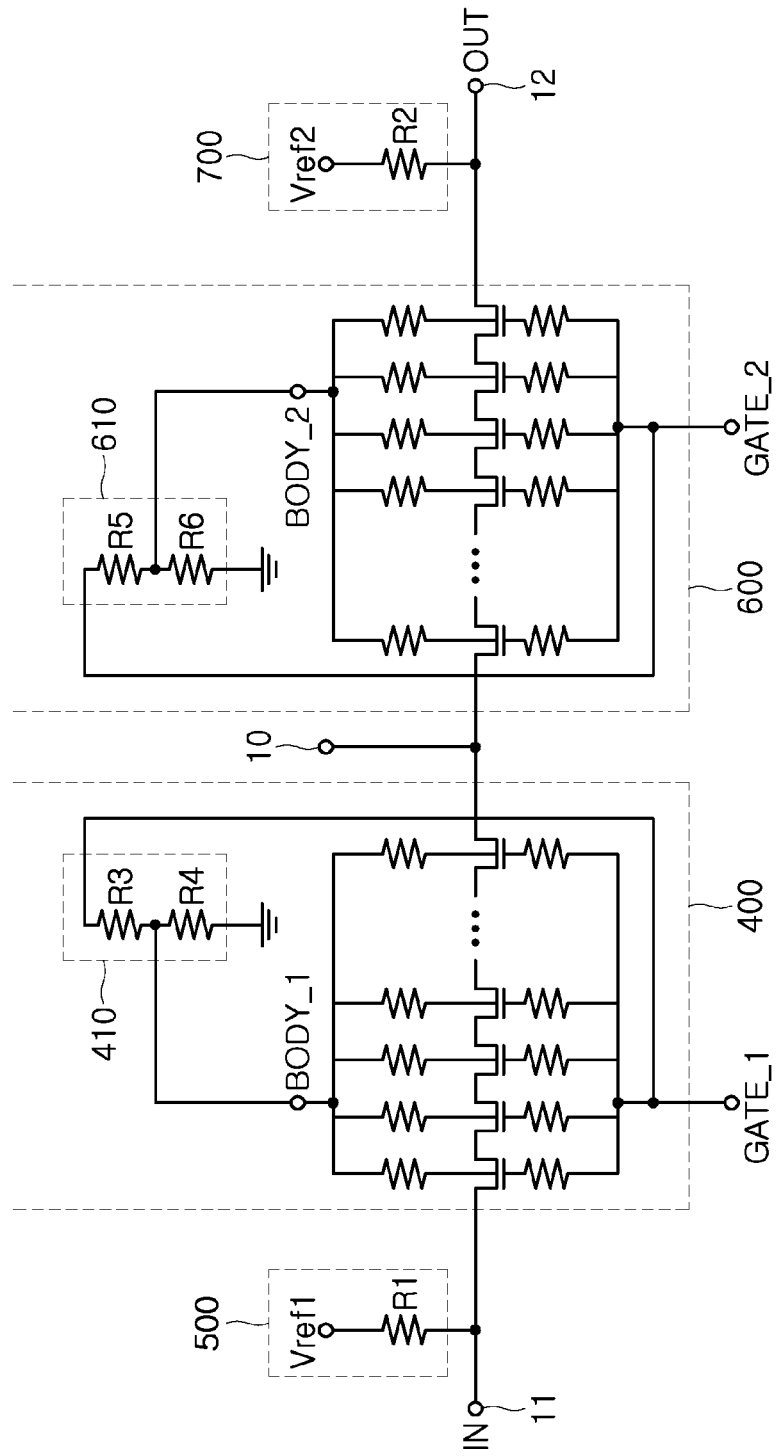
FIG. 6 is a circuit diagram illustrating the RF switch shown in FIG. 5 in more detail.

FIG. 6 is a circuit diagram illustrating the RF switch shown in FIG. 5 in more detail.

Referring to FIG. 5, the RF switch according to an exemplary embodiment of the present disclosure may include a common port 10, a first switching unit 400, a second switching unit 600, a first reference voltage unit 500, and a second reference voltage unit 700.

The common port 10 may be connected to an antenna to transmit or receive a high frequency signal.

The first switching unit 400 may include a plurality of first body contact type switching devices connected to each other in series between the common port 10 and a first port 11, and a first voltage generating unit 410.

One example of the plurality of first body contact type switching devices may be metal oxide silicon field effect transistors (MOSFETs). The number of MOSFETs configuring the first switching unit 400 may be appropriately changed by a withstand voltage required by the switching circuit. In addition, each of the plurality of MOSFETs has a source terminal and a drain terminal, which are not distinguished from each other in a structure of the MOSFET. Therefore, in the present specification, the meaning that the MOSFETs are connected to each other in series is that one of source and drain terminals of one MOSFET is connected to one of source and drain terminals of another MOSFET.

In addition, the plurality of respective first body contact type switching devices may have bodies connected to a first common body terminal BODY_1 through body resistors, and the first common body terminal BODY_1 may be connected to the first voltage generating unit 410.

That is, the plurality of first body contact type switching devices may be body contact type FETs and in this case, the body resistors may be provided to reduce loss caused by leakage power from a body region.

Meanwhile, respective gate resistors may be provided between gate terminals of the plurality of first body contact type switching devices and a first common control terminal GATE_1.

The plurality of first body contact type switching device may allow or block a signal transfer path between the signal input terminal IN and the first port 11 by performing a switching operation.

Meanwhile, each of the plurality of first body contact type switching devices may be formed as a thin gate, and the thin gate may have a thickness of 2.2 nm or less.

The first voltage generating unit 410 may be connected between the first common control terminal GATE_1 and the first common body terminal BODY_1. Referring to FIG. 6, the first voltage generating unit 410 may include first and second resistor elements R3 and R4 connected to each other in series. In this case, the first voltage generating unit 410 may divide a voltage received from the first common control terminal GATE_1 by resistance values of the first and second resistor elements R3 and R4 to thereby provide the divided voltage to the first common body terminal BODY_1.

The second switching unit 600 may include a plurality of second body contact type switching devices connected to each other in series between the common port 10 and a second port 12, and a second voltage generating unit 610.

One example of the plurality of second body contact type switching devices may be metal oxide silicon field effect transistors (MOSFET). The number of MOSFETs configuring the second switching unit 600 may be appropriately changed by a withstand voltage required by the switching circuit. In addition, each of the plurality of MOSFETs has a source terminal and a drain terminal, which are not distinguished from each other in a structure of the MOSFET. Therefore, in the present specification, the meaning that the MOSFETs are connected to each other in series is that one of source and drain terminals of one MOSFET is connected to one of source and drain terminals of another MOSFET.

In addition, the plurality of respective second body contact type switching devices may have bodies connected to a second common body terminal BODY_2 through body resistors, and the second common body terminal BODY_2 may be connected to the second voltage generating unit 610.

That is, the plurality of second body contact type switching devices may be body contact type FETs, and the body resistors may be provided to reduce loss caused by leakage power from the body region as described above.

Meanwhile, the respective gate resistors may be provided between gate terminals of the plurality of second body contact type switching devices and a second common control terminal GATE_2.

The plurality of second body contact type switching device may allow or block a signal transfer path between the signal input terminal IN and the second port 12 by performing a switching operation.

Meanwhile, each of the plurality of second body contact type switching devices may be formed as a thin gate, and the thin gate may have a thickness of 2.2 nm or less.

The second voltage generating unit 610 may be connected between the second common control terminal GATE_2 and the second common body terminal BODY_2. Referring to FIG. 6, the second voltage generating unit 610 may include third and fourth resistor elements R5 and R6 connected to each other in series. In this case, the second voltage generating unit 610 may divide a voltage received from the second common control terminal GATE_2 by resistance values of the third and fourth resistor elements R5 and R6 to thereby provide the divided voltage to the second common body terminal BODY_2.

The first reference voltage unit 500 may be disposed between the first switching unit 400 and the first port 11 to provide a first reference voltage. The second reference voltage unit 700 may be disposed between the second switching unit 600 and the second port 12 to provide the second reference voltage.

Meanwhile, as another example of the RF switch according to an exemplary embodiment of the present disclosure, the first reference voltage unit 500 may receive a voltage output from the first voltage generating unit 410 to set the first reference voltage. Similarly, the second reference voltage unit 700 may receive a voltage output from the second voltage generating unit 610 to set the second reference voltage.

An operation of the RF switch according to an exemplary embodiment of the present disclosure will be described.

A case in which the first switching unit 400 is an on-port and the second switching unit 600 is an off-port will be described. In addition, a case in which the first switching unit 400 is an off-port and the second switching unit 600 is an on-port may also be considered (a description of this case will be omitted).

When a control voltage having a high level is applied to the first common control terminal GATE_1, all the plurality of first body contact type switching devices included in the first switching unit 400 may be electrically conducted. Therefore, the first switching unit 400 may be the on-port, such that a signal input from the first port 11 is transferred to the antenna through the common port 10.

In this case, when a voltage generated by dividing the voltage from the first common control terminal GATE_1 by the resistance values of the third and fourth resistor elements R3 and R4 is Vb_1, Vb_1 may be expressed by the following Equation 4.

$$Vb\_1 = \{R4/(R3+R4)\} * \text{the first control voltage } Vg \quad \text{[Equation 4]}$$

In this case, the resistance values of the first resistor element R3 and the second resistor element R4 may be preset such that a voltage difference between the voltage Vb_1 and a first reference voltage Vref1 is not present. In this case, the voltage difference between the first reference voltage Vref1 and the voltage Vb_1 may not be generated.

In this case, a high frequency signal may not flow in the first common body terminal BODY_1 and the plurality of first body contact type switching devices of the first switching unit 400 may be normally turned on.

Meanwhile, since a control voltage having a low level is input to the second common control terminal GATE_2, all the plurality of second body contact type switching devices of the second switching unit 600 are in a blocked state. Therefore, since the second switching unit 600 may be the off-port, even in a case in which a signal is input to the second port 12, the signal may not be transferred to the antenna through the common port 10.

The second voltage generating unit 610 may divide the voltage received from the second common control terminal GATE_2 of the second switching unit 600 by resistance values of the third resistor element R5 and the fourth resistor element R6 to thereby provide the divided voltage to the second common body terminal BODY_2.

In this case, when the voltage provided to the second common body terminal BODY_2 is Vb_2, the resistance values of the third and fourth resistor elements R5 and R6 may be set such that a voltage difference between the voltage Vb_2 and a second reference voltage Vref2 is not generated.

In a case in which all the plurality of second body contact type switching devices included in the second switching unit 600 are turned off, since the second reference voltage has a value higher than that of Vb_2, a gate to source voltage Vgs and a body to source voltage Vbs of each of the second body contact type switching devices may have a negative value.

In this case, the gate to source voltage Vgs of each of the plurality of second body contact type switching devices may be expressed by the following Equation 5. In addition, the body to source voltage Vbs of each of the plurality of second body contact type switching devices may be expressed by the following Equation 6.

The gate to source voltage *Vgs*=the voltage provided from the second common control terminal GATE_2–the second reference voltage    [Equation 5]

The body to source voltage *Vbs*=the second reference voltage–the voltage *Vb_2* provided to the second common body terminal BODY_2    [Equation 6]

In this case, according to the related art, when each of the plurality of second body contact type switching devices is turned off to be 0V, a case which a portion of the switching devices is slightly turned on occurs, such that linearity of the switching circuit including the plurality of switching devices may be deteriorated.

However, in the RF switch according to an exemplary embodiment of the present disclosure, the gate to source voltage Vgs and the body to source voltage Vbs of each of the plurality second body contact type switching devices have the negative voltage and correspondingly, each of the plurality of switching devices is turned off, such that a complete turn off state may be implemented.

Meanwhile, the RF switch according to an exemplary embodiment of the present disclosure may perform a port switching operation by the above-mentioned operations.

Figure 7:
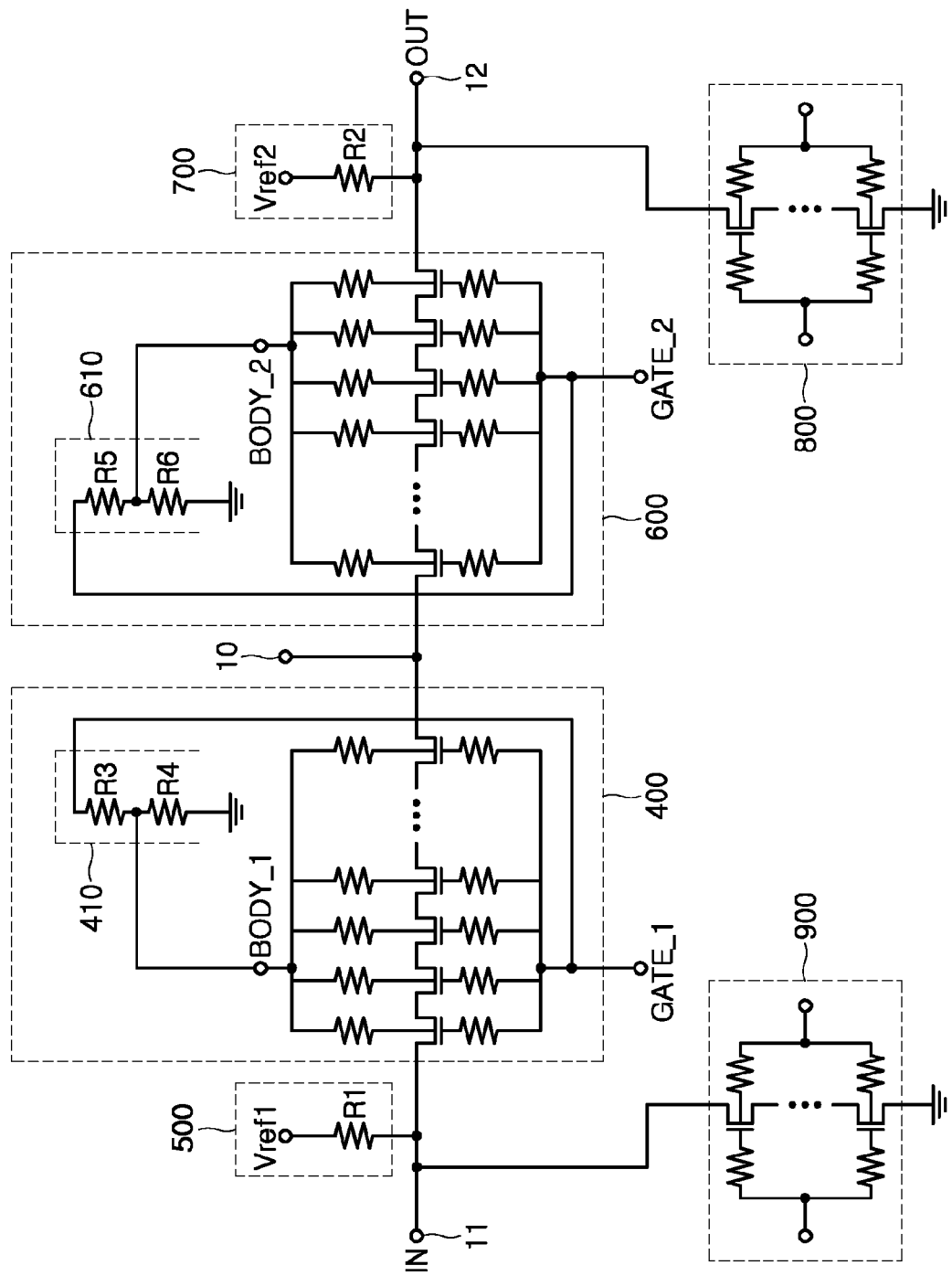
FIG. 7 is a circuit diagram in which a shunting unit is added to the RF switch shown in FIG. 6.

FIG. 7 is a circuit diagram in which a shunting unit is added to the RF switch shown in FIG. 6.

Referring to FIG. 7, the RF switch according to an exemplary embodiment of the present disclosure may further include a first shunting unit 800 and a second shunting unit 900.

The first shunting unit 800 may be connected between the second port 12 and the second switching unit 600 to allow or block a signal transfer path between the second port 12 and a ground. In this case, the first shunting unit 800 may include a plurality of first body contact type switching devices connected to each other in series. The first shunting unit 800 may receive the same control voltage as that of the second common control terminal GATE_2 of the second switching unit 600 to perform a switching operation.

The second shunting unit 900 may be connected between the first port 11 and the first switching unit 400 to allow or block a signal transfer path between the first port 11 and a ground. In this case, the second shunting unit 900 may include a plurality of second body contact type switching devices connected to each other in series. The second shunting unit 900 may receive the same control voltage as that of the first common control terminal GATE_1 of the first switching unit 400 to perform a switching operation.

As set forth above, according to exemplary embodiments of the present disclosure, the switching circuit in which linearity characteristics and harmonic characteristics may be improved and further, leakage current caused by the body of the switching device may be significantly reduced, and the RF switch including the same, may be provided.

While exemplary embodiments have been shown and described above, it will be apparent to those skilled in the art that modifications and variations could be made without departing from the spirit and scope of the present disclosure as defined by the appended claims.

What is claimed is:

1. A switching circuit comprising:
 a switching circuit unit including a plurality of switching devices connected to each other in series;
 a reference voltage unit connected between the switching circuit unit and a signal input terminal and providing a preset reference voltage; and
 a voltage generating unit dividing a first control voltage provided to the switching circuit unit by a preset magnitude to generate a second control voltage corresponding to the reference voltage, and providing the second control voltage to bodies of the plurality of respective switching devices.

2. The switching circuit of claim 1, further comprising:
 a plurality of gate resistors respectively connected between respective control terminals of the plurality of switching devices and a common control terminal,
  wherein the plurality of switching devices respectively receive the first control voltage through the plurality of gate resistors.

3. The switching circuit of claim 1, further comprising:
 a plurality of body resistors respectively connected between the respective bodies of the plurality switching devices and a common body terminal,
  wherein the plurality of switching devices respectively receive the second control voltage through the plurality of body resistors.

4. The switching circuit of claim 1, wherein the reference voltage unit includes at least one resistor element.

5. The switching circuit of claim 1, wherein the voltage generating unit includes first and second resistor elements connected to each other in series and divides the first control voltage by resistance values of the first and second resistor elements to generate the second control voltage.

6. The switching circuit of claim 1, wherein the reference voltage unit receives the second control voltage from the voltage generating unit to set the reference voltage.

7. The switching circuit of claim 1, wherein each of the plurality of switching devices is a metal oxide silicon field effect transistor (MOSFET) and the MOSFET has a gate thickness of 2.2 nm or less.

8. A RF (Radio Frequency) switch comprising:
 a common port connected to an antenna to transmit and receive a high frequency signal;
 a first switching unit having a plurality of first body contact type switching devices connected to each other in series between the common port and a first port;

a second switching unit having a plurality of second body contact type switching devices connected to each other in series between the common port and a second port;

a first reference voltage unit disposed between the first switching unit and the first port to provide a first reference voltage; and a second reference voltage unit disposed between the second switching unit and the second port to provide a second reference voltage, wherein the first switching unit divides a voltage received from a first common control terminal of the plurality of first body contact type switching devices by a resistance value preset in such a manner that a voltage difference between the first reference voltage and the voltage received from the first common control terminal is not present, to thereby provide the divided voltage to a first common body terminal of the plurality of first body contact type switching devices, and the second switching unit divides a voltage received from a second common control terminal of the plurality of second body contact type switching devices by a resistance value preset in such a manner that a voltage difference between the second reference voltage and the voltage received from the second common control terminal is not present, to thereby provide the divided voltage to a second common body terminal of the plurality of second body contact type switching devices.

9. The RF switch of claim 8, wherein the first switching unit further includes a first voltage generating unit connected between the first common control terminal and the first common body terminal, and the second switching unit further includes a second voltage generating unit connected between the second common control terminal and the second common body terminal.

10. The RF switch of claim 9, wherein the first voltage generating unit includes first and second resistor elements connected to each other in series and divides the voltage received from the first common control terminal by resistance values of the first and second resistor elements to thereby provide the divided voltage to the first common body terminal, and the second voltage generating unit includes third and fourth resistor elements connected to each other in series and divides the voltage received from the second common control terminal by resistance values of the third and fourth resistor elements to thereby provide the divided voltage to the second common body terminal.

11. The RF switch of claim 8, wherein each of the first and second reference voltage units includes at least one resistor element.

12. The RF switch of claim 9, wherein the first reference voltage unit receives a voltage output from the first voltage generating unit to set the first reference voltage, and the second reference voltage unit receives a voltage output from the second voltage generating unit to set the second reference voltage.

13. The RF switch of claim 8, further comprising:

a first shunting unit connected between the second port and the second switching unit to allow or block a signal transfer path between the second port and a ground; and a second shunting unit connected between the first port and the first switching unit to allow or block a signal transfer path between the first port and a ground.

14. The RF switch of claim 8, wherein each of the plurality of first and second body contact type switching devices is a metal oxide silicon field effect transistor (MOSFET) and the MOSFET has a gate thickness of 2.2 nm or less.

* * * * *